US 6,606,008 B2

(12) United States Patent
Traub

(10) Patent No.: US 6,606,008 B2
(45) Date of Patent: Aug. 12, 2003

(54) OSCILLATOR CIRCUIT

(75) Inventor: Johann Traub, Lauingen (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/991,790

(22) Filed: Nov. 19, 2001

(65) Prior Publication Data

US 2002/0060612 A1 May 23, 2002

(30) Foreign Application Priority Data

Nov. 17, 2000 (DE) ......................... 100 56 942

(51) Int. Cl.$^7$ ................................. H03B 5/00
(52) U.S. Cl. ...................... 331/117 R; 331/117 FE; 331/167
(58) Field of Search .................. 331/113 R, 114, 331/115, 116 FE, 117 FE, 117 R, 177 V, 167

(56) References Cited

U.S. PATENT DOCUMENTS

| 5,396,195 | A | 3/1995 | Gabara |
| 5,680,077 | A | 10/1997 | Jonely et al. |
| 6,342,820 | B1 * | 1/2002 | Leyten et al. ............ 331/117 D |
| 6,469,586 | B1 * | 10/2002 | Rogers et al. ........... 331/117 R |

OTHER PUBLICATIONS

Giuseppe Ferri et al.: "Low Voltage Design III", Electronics World, Nov. 1999, pp. 949–955.
Markus Zannoth et al.: "A Fully Integrated VCO at 2 GHz", IEEE Journal of Solid–State Circuits, vol. 33, No. 12, Dec. 1998, pp. 1987–1991.
C.–M. Hung et al.: A 1.24–GHz Monolithic CMOS VCO with Phase Noise of—137 dBc/Hz at a 30MHz Offset, IEEE Microwave and Guided Wave Letters, vol. 9, No. 3, Mar. 1999, pp. 111–113.

Tietze et al.: "Halbleiter–Schaltungstechnik" (Semiconductor Circuit Technology), 10. Edition, 1993, pp. 458–460.

* cited by examiner

*Primary Examiner*—Robert Pascal
*Assistant Examiner*—Kimberly E Glenn
(74) *Attorney, Agent, or Firm*—Laurence A. Greenberg; Werner H. Stemer; Gregory L. Mayback

(57) ABSTRACT

An oscillator circuit is described and has an oscillator core with at least one inductance and, connected thereto, a first and second capacitance. A deattenuator is coupled to the oscillator core and has two transistors, which are cross-coupled to one another in a non-direct-electrical coupling. The respective load terminal of a respective transistor is directly connected to a reference-ground potential terminal. The non-direct-electrical, for example inductive, coupling of the transistors in combination with the transistors directly connected to ground enables a greater modulation capability and also a smaller phase noise of the oscillator circuit. In this case, the transistors are operated as current switches. In preferred embodiments, the oscillator circuit has a regulating circuit for a bias voltage and an operating-current setting. The present oscillator circuit is suitable for mobile radio applications with stringent phase noise requirements in the gigahertz range and can be integrated into CMOS circuit technology.

11 Claims, 4 Drawing Sheets

OSCILLATOR CIRCUIT

BACKGROUND OF THE INVENTION

FIELD OF THE INVENTION

The present invention relates to an oscillator circuit having an oscillator core with at least one inductance and, connected thereto, a first capacitance and a second capacitance, whose capacitance values are adjustable by a control voltage. A deattenuation amplifier is coupled to the oscillator core and has a first transistor and a second transistor, which are cross-coupled to one another in a non-direct-electrical coupling.

In applications in the mobile radio range, fully integrated voltage-controlled oscillators (VCO) having output frequencies in the gigahertz range are subject to increasingly stringent requirements with regard to their phase noise.

The principle of generating a sinusoidal oscillation which underlies LC oscillators is characterized by deattenuation of an LC tuned circuit with the aid of an amplifier, see for example, the reference by Tietze, and Schenk, titled "Halbleiter-Schaltungstechnik [Semiconductor Circuitry]", 10th Edition 1993, page 458 et seq. Feedback differential amplifiers are usually used as amplifiers in integrated DCO circuits, and are constructed using CMOS or bipolar circuit technology. In this case, the feedback can be interpreted such that it forms a negative resistance that compensates a resistance loss in the resonant circuit or tuned circuit and thus deattenuates the resonant circuit.

The document titled "A 1.24-GHz Monolithic CMOS VCO with Phase Noise of −137 dBc/Hz at a 3-Megahertz Offset", by C. M. Hung et al., IEEE Microwave and Guided Wave Letters, Vol. 9, No. 3, March 1999, specifies a VCO which is constructed using CMOS circuit technology and has two transistors cross-coupled in a respective direct-electrical connection as amplifier. As the current source for the differential amplifier, a CMOS transistor connected as a current source is connected between the VCO core and the reference-ground potential terminal.

A VCO of the generic type, in which the transistors of the differential amplifier are cross-coupled in a non-direct-electrical coupling, is specified in the document titled "A Fully Integrated VCO at 2 GHz", by M. Zannoth, B. Kolb, J. Fenk, and R. Weigl, IEEE Journal of Solid-State Circuits, Vol. 33, No. 12, December 1998. This is constructed using bipolar circuit technology.

The VCO circuits described have the disadvantage, however, that, on account of the current sources used, the voltage range available to the differential amplifier and hence the signal amplitudes at the resonator are limited, so that the phase noise properties that can be obtained are also limited.

SUMMARY OF THE INVENTION

It is accordingly an object of the invention to provide an oscillator circuit which overcomes the above-mentioned disadvantages of the prior art devices of this general type, in which the modulation range is increased and the phase noise is reduced.

With the foregoing and other objects in view there is provided, in accordance with the invention, an oscillator circuit. The oscillator circuit contains an oscillator core having at least one inductance, a first capacitance connected to the inductance, and a second capacitance connected to the first capacitance. The first capacitance and the second capacitance have capacitance values adjustable by a control voltage. A reference-ground potential terminal is provided. A deattenuation amplifier is coupled to the oscillator core and has a first transistor and a second transistor cross-coupled to the first transistor in a non-direct-electrical coupling manner. The first transistor and the second transistor each have a first load terminal directly connected to the reference-ground potential terminal, a second load terminal, and a control terminal.

According to the invention, the object is achieved in the case of an oscillator circuit of the generic type in which a respective load terminal of a respective transistor is directly connected to a reference-ground potential terminal.

In this case, the load terminal of the transistors that is directly connected to the reference-ground potential terminal is preferably a source terminal of a field-effect transistor or an emitter terminal of a bipolar transistor.

In this case, the oscillator circuit is based on the principle of not connecting the transistors of the deattenuation amplifier to a current source which supplies a constant current, and consequently operating the cross-coupled transistors as a differential amplifier, but rather connecting the transistors directly to a reference-ground potential terminal, so that, in DC voltage turns, the entire supply voltage can be dropped across the transistors, and, consequently, a maximum voltage swing is possible and the transistors are operated as switches or current switches. In the cross-coupling of the transistors, this necessitates direct-electrical isolation between the control and the load terminals of the transistors in the cross-coupling. This can be achieved by non-direct-electrical couplings, such as a transformer coupling or a capacitive coupling.

Furthermore, a regulating circuit that regulates a bias voltage of the transistors and also an operating current of the circuit may be provided for the operation of the oscillator circuit.

Overall, the oscillator circuit exhibits high stability, good integrability, suitability for operation at high frequencies in the gigahertz range and a low phase noise on account of the higher modulation capability. On account of the higher voltage swing at the inputs of the deattenuation amplifier, it is possible to use transistors having a small configuration that can be operated with a higher current density. The use of smaller transistors that have smaller parasitic capacitances allows the use of larger capacitances with a tunable capacitance value in the oscillator core, thereby increasing the tuning range of the oscillator circuit.

Moreover, transistors with a higher current density have a better radio-frequency behavior, in particular a higher transition frequency.

In order to further increase the signal levels and also to achieve greater interference immunity, the oscillator circuit can be constructed using differential circuit technology. The oscillator circuit can be realized using CMOS circuit technology.

In an advantageous embodiment of the present invention, for the non-direct-electrical cross-coupling of the first and second transistors, a first transformer is provided, which inductively couples a load terminal of the first transistor to a control terminal of the second transistor, and a second transformer is provided, which inductively couples a load terminal of the second transistor to a control terminal of the first transistor. The transformer windings that form inductances may at the same time be inductances in the oscillator core of the LC oscillator. Instead of using two transformers, it is possible to use one transformer whose windings each have a center tap.

In an advantageous embodiment of the invention, the first and second transformers in each case have a turns ratio other than 1. In this case, the turns ratio of a transformer or inductive transformer is defined as the ratio of the number of turns of the primary and secondary windings. The transformer coupling thus makes it possible to increase the control voltages of the transistors relative to the voltages at the load terminal coupled to the control terminal, as a result of which the noise properties of the oscillator circuit are further improved.

In a preferred embodiment, for the non-direct-electrical cross-coupling of the first and second transistors, a respective coupling capacitor is connected between the control input of the first transistor and a load terminal of the second transistor and also between the control input of the second transistor and a load terminal of the first transistor. The coupling capacitors of the capacitive coupling can be integrated in a simple manner with a small area requirement. The capacitive coupling may additionally have coupling resistors for forming a bias coupling between load terminals of the transistors and a bias regulating circuit.

In a further advantageous embodiment, the regulating circuit for the bias voltage of the transistors is provided. The regulating circuit has a respective bias transistor which, on a control side, is in each case connected to the control input of the first and of the second transistor, respectively, and, on the load side, is coupled to the oscillator core and also connected to a reference current source. The bias voltage regulation of the transistors simultaneously holds the operating current of the oscillator circuit at a predetermined reference value. This results in the oscillator circuit being independent of fluctuations in the supply voltage and other varying parameters.

In a further preferred embodiment, the regulating circuit for the bias voltage of the transistors is provided which contains a bias transistor connected as a diode. The bias transistor is on the one hand connected to the reference-ground potential terminal and on the other hand is connected to a reference current source and coupled to the oscillator core. Besides saving a bias transistor, the configuration of the regulating circuit is suitable for realizing a lower-noise oscillator compared with the one mentioned above.

In a further preferred embodiment of the invention, output transistors are provided, whose control inputs are in each case connected to those of the first and of the second transistor, respectively, and which have load terminals at which an output signal of the oscillator circuit can be drawn off. The output signal is a differential signal. The current of the output signal is thus proportional to the current in the oscillator core, good synchronism properties being associated with this. For further signal processing, a cascode circuit, for example, can be connected to the output transistors.

In a further preferred embodiment, the first and second capacitances of the oscillator core in each case contain a capacitor with a variable-capacitance diode connected thereto. Either the capacitance values of the capacitors or the capacitance values of the variable-capacitance diodes or both capacitance values are adjustable by the control voltage that can be fed to the oscillator circuit.

In a further preferred embodiment of the present invention, the variable-capacitance diodes are directly connected to one another by their anodes. This further improves the integrability of the circuit.

In a further preferred embodiment of the invention, the transistors of the oscillator circuit are CMOS transistors.

Other features which are considered as characteristic for the invention are set forth in the appended claims.

Although the invention is illustrated and described herein as embodied in an oscillator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
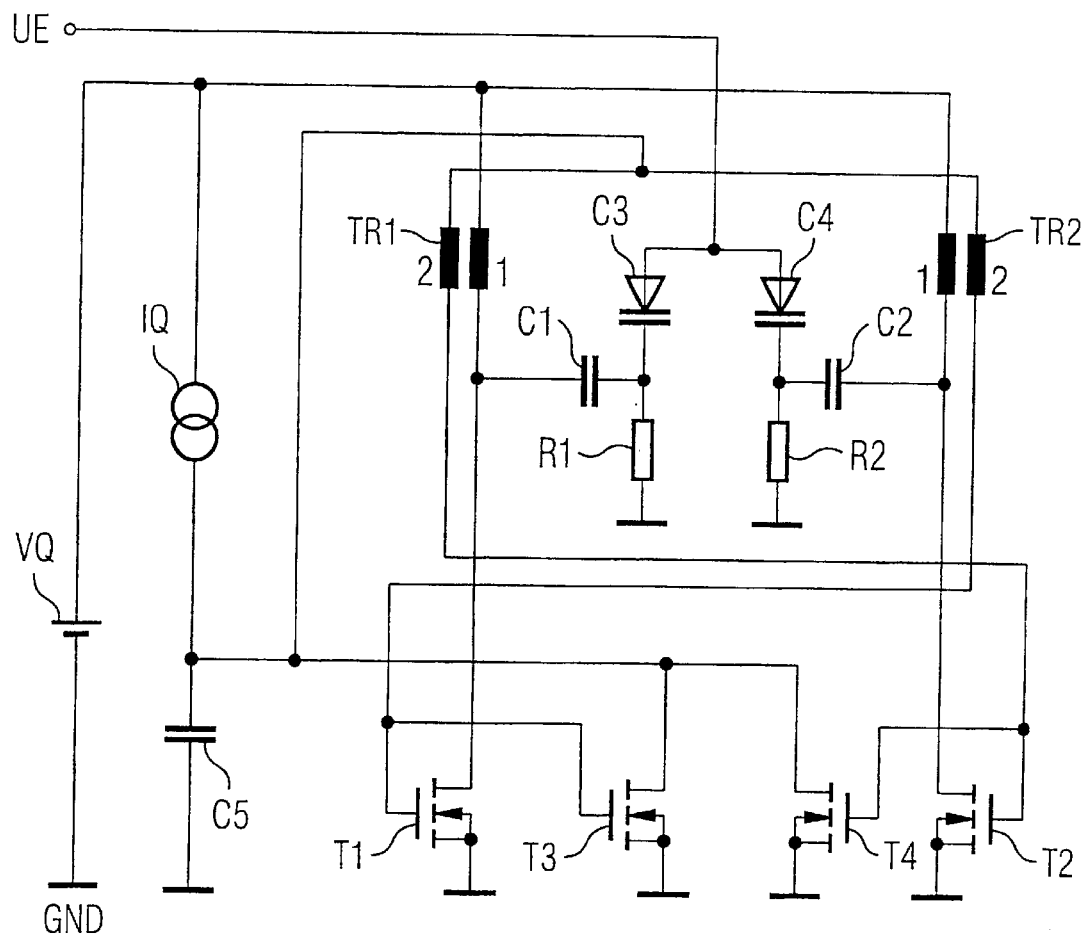
FIG. 1 is a basic circuit diagram of an exemplary embodiment of an oscillator circuit with inductive coupling according to the invention.

Referring now to the figures of the drawing in detail and first, particularly, to FIG. 1 thereof, there is shown an oscillator circuit having an oscillator core with a first capacitance, which contains a capacitor C1 and a variable-capacitance diode C3, and a second capacitance, which contains a capacitor C2 and a variable-capacitance diode C4. The first and second capacitances, together with an inductive component of a respective transformer TR1, TR2, form an LC tuned circuit. The transistors T1, T2 of a deattenuation amplifier deattenuate the oscillator core. A voltage source VQ is provided for supplying power to the oscillator core and the deattenuation amplifier. The setting of a bias voltage of the transistors T1, T2 and also the regulation of an operating current of the circuit are effected by a regulating circuit containing bias transistors T3, T4, a reference current source IQ and also a capacitance C5 for stabilizing the operating point.

A control voltage UE can be fed to the oscillator core, more precisely to the variable-capacitance diodes C3, C4, for frequency tuning of the oscillator core, which control voltage can be applied to anodes of the variable-capacitance diodes C3, C4. Connected to cathode terminals of the variable-capacitance diodes C3, C4 is a respective capacitor C1, C2 and also, relative to a reference-ground potential terminal GND, a respective resistor R1, R2. A further terminal of the capacitors C1, C2 is respectively connected to the transformer TR1, TR2 at a connection of a first winding. The other connection of the first windings of the first and second transformers TR1, TR2 is connected, for the purpose of supplying a voltage to the circuit, to a voltage source VQ which, at the other end, is connected to the reference-ground potential terminal GND. Furthermore, a respective load terminal of the first and of the second transistor T1, T2 is connected to the first winding of the first and of the second transformer TR1, TR2, respectively. A further load terminal of the transistors T1, T2 is in each case directly connected to the reference-ground potential terminal GND. In order to realize an inductive cross-coupling, the control input of the first transistor T1 is connected to a connection of the second winding of the second transformer TR2 and the control input of the second transistor T2 is connected to a connection of the second winding of the first transformer TR1. A respective further connection of the second windings of the first and second transformers TR1, TR2 are connected to one another and to the regulating circuit, more precisely to a terminal of the capacitance C5 and a terminal of a reference current source IQ. A respective further terminal of the fifth capacitance C5 and of the reference current source IQ is connected to the reference-ground potential terminal GND and, respectively, to a connection of the first windings of the two transformers TR1, TR2. Controlled paths of the bias transistors T3, T4 are connected in parallel with the capacitance C5. The bias transistor T3 is directly connected by its control input to the control input of the first transistor T1, and the control input of the bias transistor T4 is directly connected to the control input of the second transistor T2.

The oscillator circuit described is constructed using CMOS circuit technology. The differential voltage swing that can be realized in practice with a conventionally constructed CMOS differential amplifier is approximately 3.5 volts peak to peak. In contrast, in the case of the present oscillator circuit, the differential voltage swing at the resonator is equal to 4 times the difference between the supply voltage and a residual voltage at the transistor, which is assumed to be 700 mV. Consequently, given a supply voltage of 2.7 V, the achievable differential voltage swing that can be realized in practice is 8 V peak to peak. In this case, the factor 4 is composed on the one hand of a factor 2 caused by the differential circuit technology and on the other hand of a further factor 2 based on the inductive circuitry of the transistors T1, T2.

Such a large signal swing enables a very low phase noise of the VCO described.

The regulating circuit formed by the reference current source IQ, the capacitance C5 which stabilizes the operating point, and also the bias transistors T3, T4 on the one hand serves for setting a bias voltage for the transistors and on the other hand holds the operating current of the oscillator circuit at a predeterminable reference value. Consequently, the operating current of the circuit and also the signal amplitudes of the oscillator depend only very slightly on supply voltage fluctuations and other varying parameters.

The above-described circuit of a voltage-controlled oscillator can be realized particularly well using integrated circuit technology. Besides good stability of the regulating circuit, the entire oscillator circuit exhibits high stability relative to temperature fluctuations.

The above-described high voltage swing which can be achieved at the input of the transistors T1, T2, and which can be increased further through a suitable choice of turns ratios of the transformers TR1, TR2, enables the use of comparatively small transistor structures for the transistors T1, T2 which can be operated with a high current density. Small transistors have small parasitic capacitances, so that the voltage-controlled oscillator has a larger tuning range. Finally, transistors which are operated with a higher current density usually have a better radio-frequency behavior and, in particular, a higher transition frequency. Consequently, the radio-frequency behavior of the VCO is improved overall.

Figure 2:
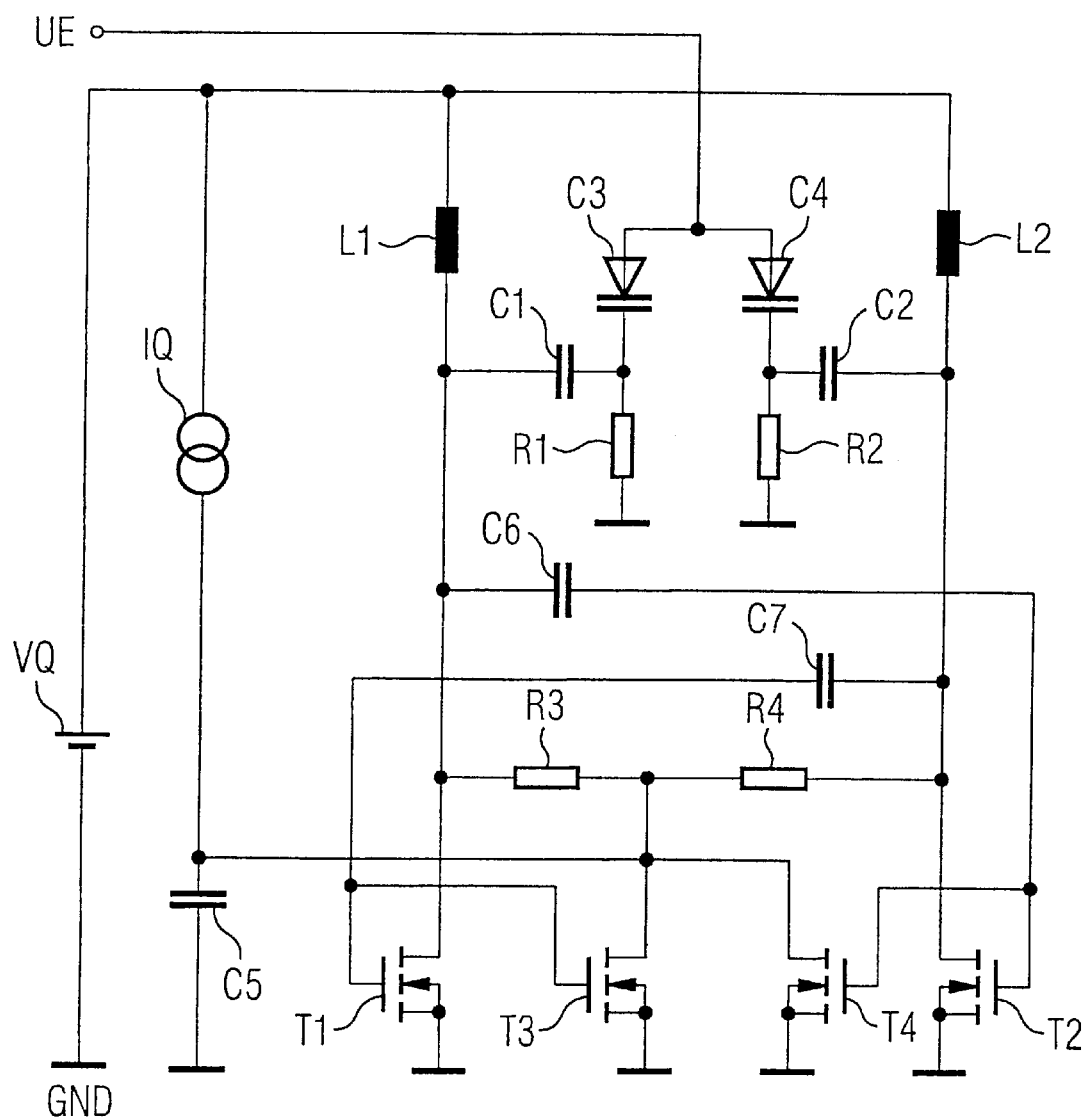
FIG. 2 is a basic circuit diagram of an exemplary embodiment of the oscillator circuit with capacitive coupling.

FIG. 2 shows a further exemplary embodiment of the oscillator circuit using a block diagram, in which the cross-coupling of the transistors T1, T2 which is realized by transformers is replaced by capacitive coupling by coupling capacitances C6, C7. Furthermore, in order to provide the resonator inductances, coils L1, L2 are used instead of the transformers TR1, TR2. DC coupling between the oscillator core and the bias regulation is realized by resistors R3, R4.

In detail, a first inductance L1 is connected on the one hand to the first capacitor C1 and on the other to the voltage source VQ while a second inductance L2 is connected on the one hand to the second capacitor C2 and on the other hand likewise to the supply voltage source VQ. The connecting node between the first inductance L1 and the first capacitor C1 is connected to a load terminal of the first transistor T1, and the connecting terminal of the second inductance L2 and the second capacitor C2 is correspondingly connected to a load terminal of the second transistor T2. The control input of the first transistor T1 is connected via a coupling capacitor C7 to a load terminal of the second transistor T2, and connected to the coupling capacitor C6 is the control input of the second transistor T2 in a cross-coupling to a load terminal of the first transistor T1. For the coupling of the regulating circuit to the oscillator core, the two resistors R3, R4 are added relative to FIG. 1, which resistors are on the one hand connected to one another and to a respective load terminal of the bias transistor T3 and T4 and on the other hand are connected to a respective load terminal of the first and of the second transistor T1, T2, respectively.

The remaining circuitry of oscillator core, the first and second transistors T1, T2 and of the regulating circuit is unchanged relative to the block diagram of FIG. 1.

Figure 3:
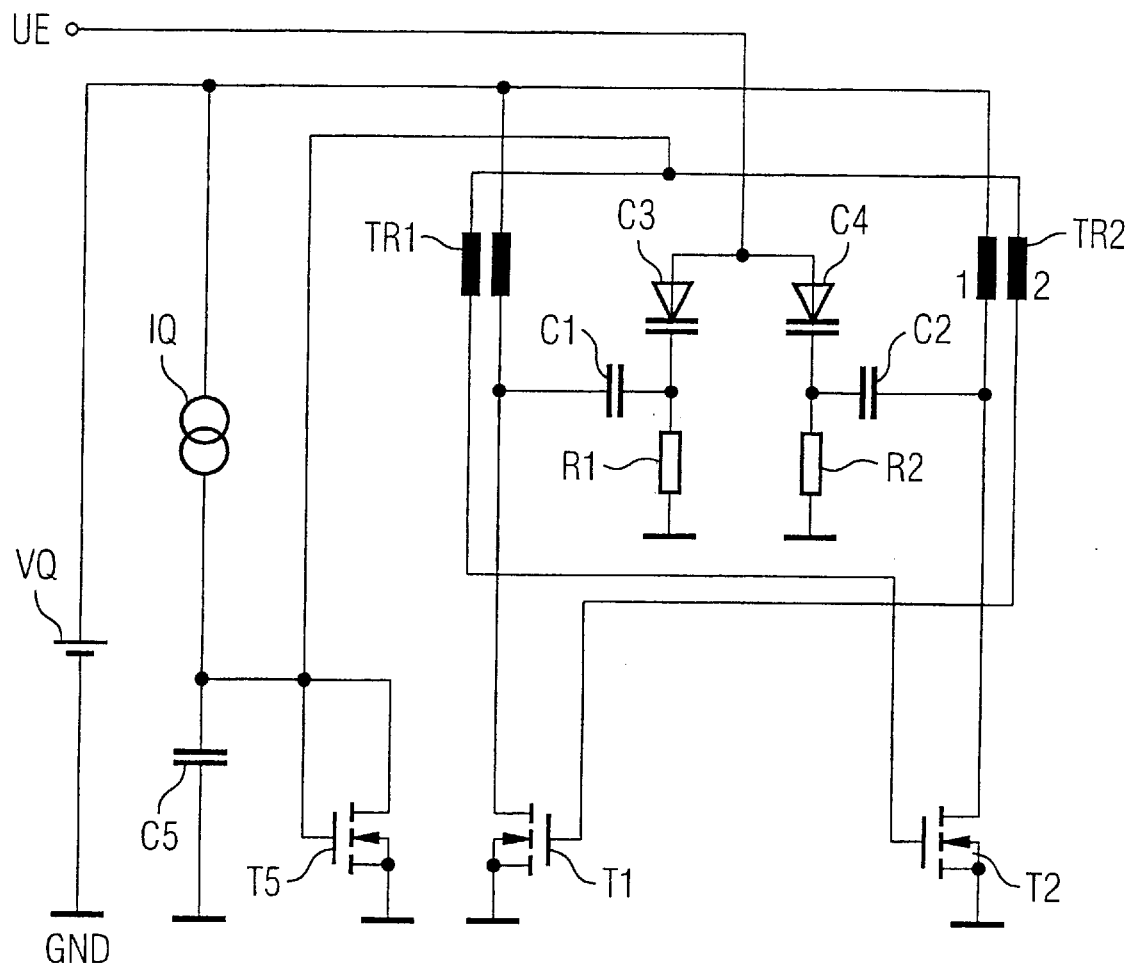
FIG. 3 is a circuit diagram of a development of the exemplary embodiment shown in FIG. 1 with only one bias transistor.

FIG. 3 shows a further exemplary embodiment of the oscillator circuit, which is changed relative to the circuit of FIG. 1 to the effect that the two bias transistors T3, T4 are omitted and are replaced by only one bias transistor T5 connected as a diode. The bias transistor T5 is connected by its control input to one of its load terminals. There is no longer a direct connection between the control input of the bias transistor T5 and the control inputs of the first and second transistors T1, T2. The transistor T5 connected up as a diode is connected to ground in parallel with the capacitance T5, which stabilizes the operating point.

Compared with the embodiment of the oscillator circuit with the two bias transistors in accordance with FIG. 1, the embodiment with only one bias transistor in accordance with FIG. 3 has the advantage that, besides saving chip area, the noise of the oscillator circuit is reduced overall.

Figure 4:
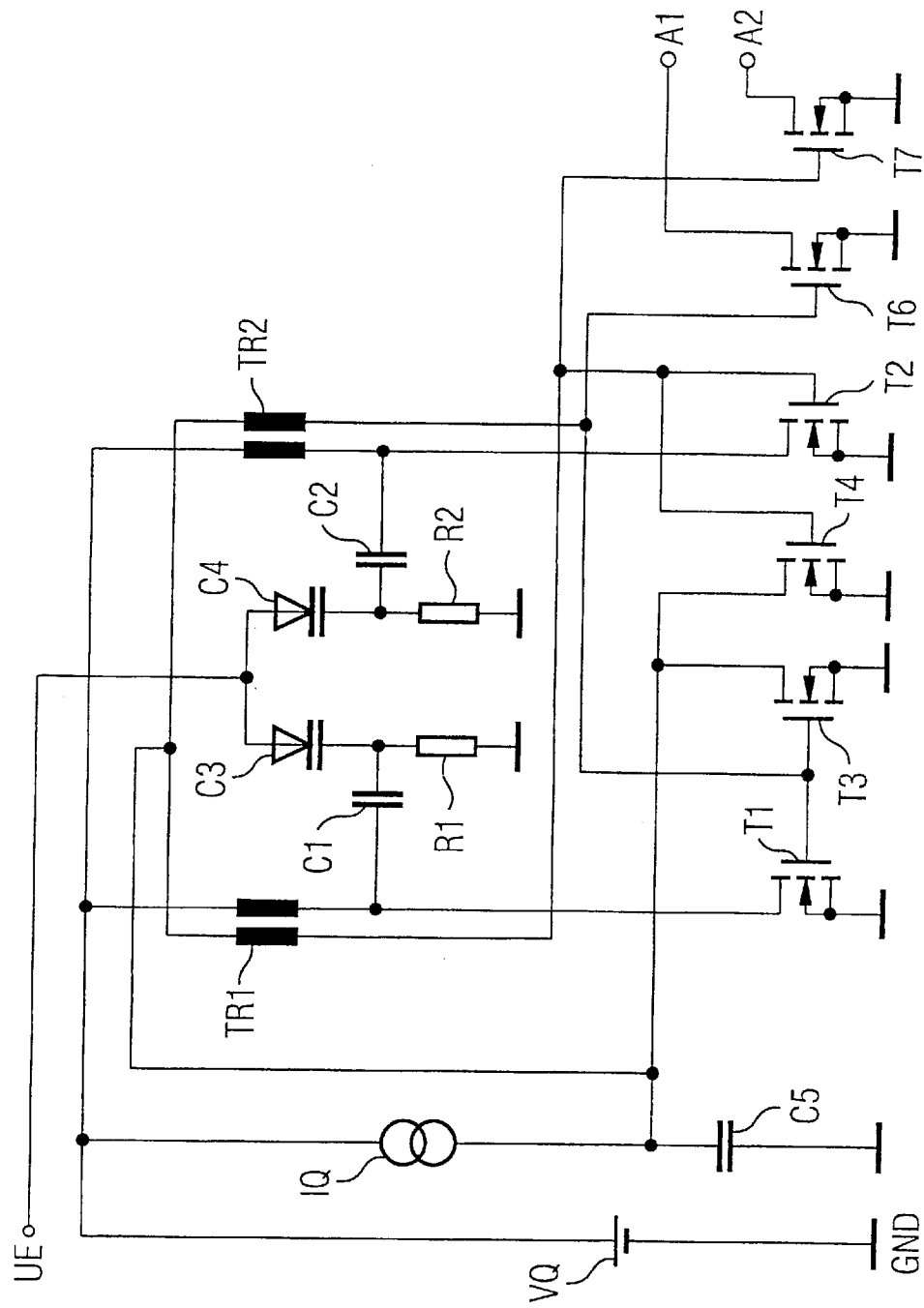
FIG. 4 is a circuit diagram of a development of the exemplary embodiment shown in FIG. 1 with additional output transistors.

A further exemplary embodiment of an oscillator circuit is illustrated in FIG. 4. The oscillator circuit is developed, in comparison with that shown in FIG. 1, by virtue of the fact that two additional output transistors T6, T7 are provided. On a control side, the output transistor T6 is connected to the control input of the first transistor T1 and a control input of the further output transistor T7 is connected to the control input of the second transistor T2. Just like the source terminals of the NMOS transistors T1 to T4, the source terminals of the NMOS output transistors T6, T7 are directly connected to the reference-ground potential terminal GND. The drain terminals of the output transistors T6, T7 form an output terminal pair with two outputs A1, A2, between which an output signal provided as a differential signal can be drawn off. The output circuitry described enables good synchronism properties and also good matching, since the currents at the output terminals A1, A2 are identical to those in the oscillator core.

Instead of the above-described oscillator core with the capacitances C1, C2, the resistors R1, R2 and the variable-capacitance diodes C3, C4, it is also possible to provide other embodiments of a tunable oscillator core. By way of example, the resistors R1, R2 and also the coupling capacitances C1, C2 can be omitted and the remaining variable-capacitance diodes can be directly connected to one another by their anodes or by their cathodes at a node at which the tuning voltage or control voltage UE can be fed in.

Instead of the NMOS transistors, that is to say n-channel transistors, shown in the figures, it is also possible to use PMOS or p-channel transistors, NMOS transistors in the present oscillator circuit enabling better radio-frequency properties.

I claim:

1. An oscillator circuit, comprising:
    an oscillator core having at least one inductance, a first capacitance connected to said inductance, and a second capacitance connected to said first capacitance, said first capacitance and said second capacitance having capacitance values adjustable by a control voltage;
    a reference-ground potential terminal; and
    a deattenuation amplifier coupled to said oscillator core and having a first transistor and a second transistor cross-coupled to said first transistor in a non-direct-electrical coupling manner, said first transistor and said second transistor each having a first load terminal directly connected to said reference-ground potential terminal, a second load terminal, and a control terminal;
    said at least one inductance including a first transformer inductively coupling said second load terminal of said first transistor to said control terminal of said second transistor, and a second transformer inductively coupling said second load terminal of said second transistor to said control terminal of said first transistor.

2. The oscillator circuit according to claim 1, wherein said first and second transformers each have a turns ratio other than 1.

3. The oscillator circuit according to claim 1, including coupling capacitors for providing the non-direct-electrical coupling, one of said coupling capacitors connected between said control terminal of said first transistor and said second load terminal of said second transistor and another of said coupling capacitors connected between said control terminal of said second transistor and said second load terminal of said first transistor.

4. The oscillator circuit according to claim 1, wherein said first and second capacitances each include a capacitor and a variable-capacitance diode connected to said capacitor.

5. The oscillator circuit according to claim 4, wherein said variable-capacitance diode of said first capacitance has an anode connected to an anode of said variable-capacitance diode of said second capacitance.

6. The oscillator circuit according to claim 1, wherein said first and second transistors are CMOS transistors.

7. An oscillator circuit, comprising:
    an oscillator core having at least one inductance, a first capacitance connected to said inductance, and a second capacitance connected to said first capacitance, said first capacitance and said second capacitance having capacitance values adjustable by a control voltage;
    a reference-ground potential terminal;
    a deattenuation amplifier coupled to said oscillator core and having a first transistor and a second transistor cross-coupled to said first transistor in a non-direct-electrical coupling manner, said first transistor and said second transistor each having a first load terminal directly connected to said reference-ground potential terminal, a second load terminal, and a control terminal;
    a reference current source having a first terminal and a second terminal;
    a supply voltage source having a first terminal connected to said first terminal of said reference current source; and
    a regulating circuit providing a bias voltage for said first and second transistors, said regulating circuit having a current path with a first side coupled to said oscillator core and connected to said second terminal of said reference current source, and, said current path having a second side coupled to said reference-ground potential terminal;
    said at least one inductance inducting a first transformer inductively coupling said second load terminal of said first transistor to said control terminal of said second transistor, and a second transformer inductively coupling said second load terminal of said second transistor to said control terminal of said first transistor.

8. The oscillator circuit according to claim 7, wherein said regulating circuit for the bias voltage of said first and second transistors includes a first regulating transistor and a second regulating transistor each having a first terminal, a second terminal and a control terminal, said control terminal of said first regulating transistor connected to said control terminal of said first transistor and said control terminal of said second regulating transistor connected to said control terminal of said second transistor, said first terminal of said first and second regulating transistors coupled to said oscillator core and connected to said reference current source, said second terminal of said first and second regulating transistors connected to said reference-ground potential terminal.

9. The oscillator circuit according to claim 7, wherein said regulating circuit for the bias voltage of said first and second transistors includes a bias transistor connected as a diode, said bias transistor connected to said reference current source and coupled to said oscillator core and also connected to said reference-ground potential terminal.

10. The oscillator circuit according to claim 7, including output transistors, each of said output transistors have a control input connected to said control terminal of one of said first and second transistors, said output transistors having load terminals where an output signal can be drawn off, the output signal being present as a differential signal.

11. The oscillator circuit according to claim 7, wherein first and second transistors are CMOS transistors.

* * * * *